United States Patent [19]

Usuda

[11] 4,438,449
[45] Mar. 20, 1984

[54] FIELD EFFECT SEMICONDUCTOR DEVICE HAVING A PROTECTIVE DIODE WITH REDUCED INTERNAL RESISTANCE

[75] Inventor: Koji Usuda, Tokyo, Japan

[73] Assignee: Hitachi, Ltd., Tokyo, Japan

[21] Appl. No.: 151,985

[22] Filed: May 21, 1980

[30] Foreign Application Priority Data

Mar. 3, 1967 [JP] Japan .................................. 42-13079

[51] Int. Cl.³ ............................................ H01L 27/02
[52] U.S. Cl. ........................................ 357/41; 357/23; 357/13; 357/51
[58] Field of Search ........................ 357/13, 23, 41, 51

[56] References Cited

U.S. PATENT DOCUMENTS 3,210,620 10/1965 Lin .
3,244,949 4/1966 Hilbiber .
3,315,096 4/1967 Carlson et al. .

*Primary Examiner*—Joseph E. Clawson, Jr.
*Attorney, Agent, or Firm*—Antonelli, Terry & Wands

[57] ABSTRACT

A semiconductor device comprising a semiconductor element having an insulated gate electrode and a protective diode region provided in the neighborhood of the semiconductor element to protect the gate electrode from a dielectric breakdown; the diode is formed by a low resistivity semiconductor material to reduce its internal resistance, thereby accelerating the action of the protective diode so that the clamp action of the diode occurs earlier than the dielectric breakdown of the gate electrode.

2 Claims, 22 Drawing Figures

FIG. 1a
PRIOR ART
FIG. 1b
PRIOR ART
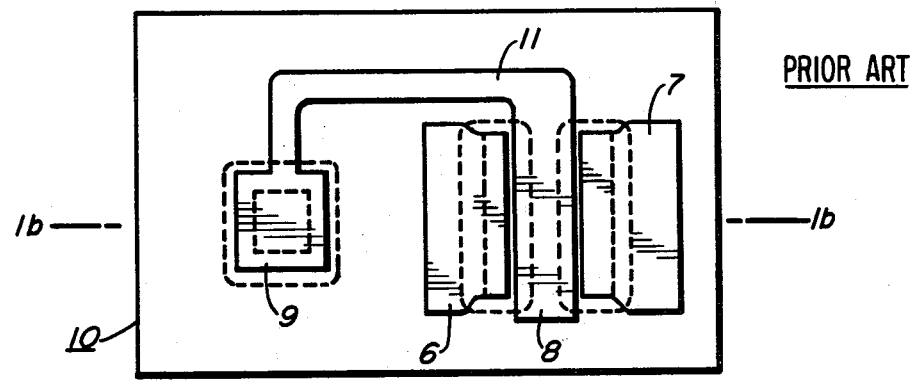
FIG. 2
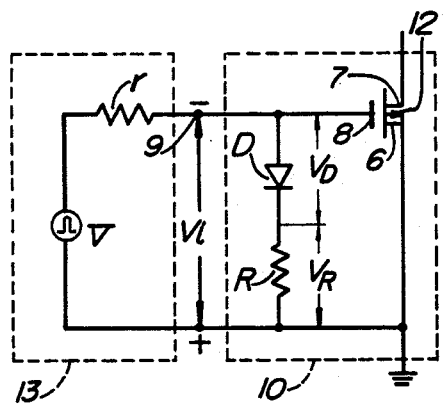
FIG. 3
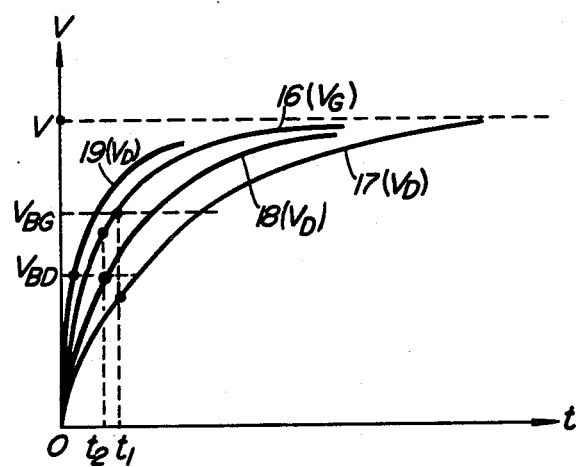

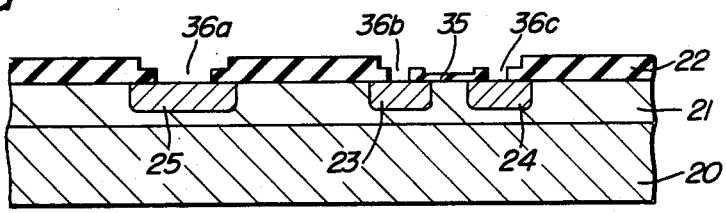
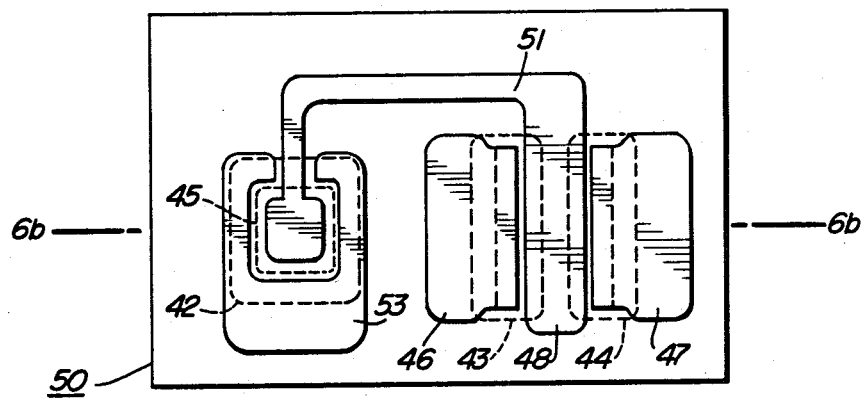
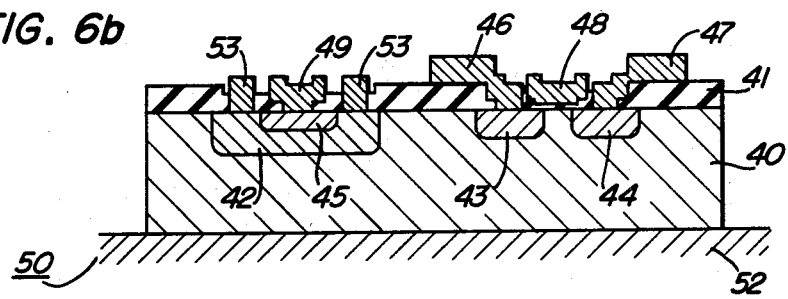
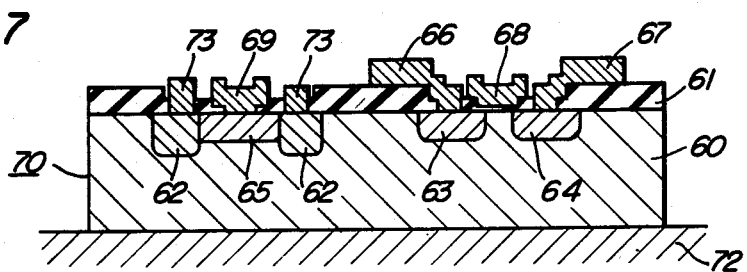

FIELD EFFECT SEMICONDUCTOR DEVICE HAVING A PROTECTIVE DIODE WITH REDUCED INTERNAL RESISTANCE

This is a continuation of application Ser. No. 728,076 filed Sept. 30, 1976 now abandoned, which application is a division of application Ser. No. 50,081 filed June 26, 1970 now U.S. Pat. No. 3,999,212 which, in turn, is a division of application Ser. No. 710,047 filed Mar. 4, 1968, now U.S. Pat. No. 3,555,374.

This invention relates to an improvement of a semiconductor device having a protective diode to prevent a device from breaking down when an input voltage larger than a prescribed voltage is applied thereto.

In a semiconductor device having an insulated gate electrode such as a well known MIS (Metal Insulator Semiconductor) type field effect transistor, it is often observed that an insulating layer under the insulated gate electrode breaks down with the application of a strong electric field. It is presumed that such a strong electric field is generated by a surge voltage due to an external noise or a charged human body. As a method of preventing the breakdown phenomenon it is proposed to connect a rectifying element such as a protective diode or a clamp diode to the input circuit of the field effect transistor and clamp the amplitude of the large surge input voltage at a lower level, at least lower than the breakdown voltage of the insulator. However, the function of the protective diode is often ineffective. Hence, dielectric breakdowns of the gate insulator have been frequent. Some improvements have been required to protect the breakdown of an MIS type semiconductor device.

Generally, a P channel enhancement mode MIS type field effect transistor comprises P-type source and drain regions in an N-type semiconductor substrate of high resistivity. Another P-type region for a protective diode is formed in the substrate separately from the transistor and is connected to the gate electrode of the transistor by means of an interconnection layer, which extends over an insulating layer disposed on the surface of the substrate. In this case, application of a negative electric potential to the gate electrode induces a P-type conducting channel layer in the surface of the semiconductor substrate underlying the interconnection layer, whereby the P-type diode region is short-circuited to the P-type source or drain region. This may be considered as the parasitic field effect phenomenon. In the case of a P-type semiconductor substrate the channel phenomenon is brought forth by an insulating film, for example, an oxide film. These phenomena should be prevented in order to make the protecting function of the diode perfect.

In order to raise the breakdown voltage of a PN junction formed between the drain region and the substrate, the resistivity of the substrate should be selected high, while in order to obtain a protective diode having a low breakdown voltage it should be selected relatively low. These opposite requirements in regard to resistivity of substrate have made it difficult to manufacture a field effect transistor having an excellent characteristic and a protective diode having a perfect protecting function.

One object of this invention is to provide a field effect semiconductor device with a protective diode having an excellent electric characteristic and stability.

Another object of this invention is to provide a field effect semiconductor device with a protective diode in which the breakdown preventing function of the diode is assured and improved.

A further object of this invention is to provide a field effect semiconductor device with a protective diode in which the bad influence due to the parasitic field effect phenomenon is eliminated.

The gist of this invention is a field effect semiconductor device with a protective diode comprising a semiconductor substrate of first conductivity type having a low resistivity region and a high resistivity region, a field effect semiconductor element with an insulated gate electrode formed at one principal surface of the high resistivity region of the substrate, a protective diode region of second conductivity type formed separately from the semiconductor element in the substrate surface, a first metal electrode fitted to the diode region, a means connecting the first metal electrode with the gate electrode, and a second metal electrode in ohmic contact with the low resistivity region of the substrate, the low resistivity region being disposed between the first and second metal electrodes so as to decrease the resistance extending from a PN-junction between the diode region and substrate toward the second metal electrode.

Concrete embodiments of this invention will be made hereunder with reference to the accompanying drawings.

FIGS. 1a and 1b are a top side view of a prior art solid circuit means of a field effect transistor having a protective diode and a cross-sectional view taken along line 1b—1b, respectively.

FIG. 2 is a rough diagram showing an electric equivalent circuit of a circuit means shown in FIGS. 1a and 1b.

FIG. 3 is a diagram showing the electrical characteristics of an inventive circuit means in comparison with a prior art.

FIGS. 5a to 5d are cross-sectional views showing the manufacturing steps of a circuit means shown in FIGS. 4a and 4b.

FIGS. 6a and 6b are a top view of a circuit means according to another embodiment of this invention and a cross-sectional view taken along the line 6b—6b, respectively.

FIG. 7 is a cross-sectional view of a modified embodiment of this invention.

Figure 4A:
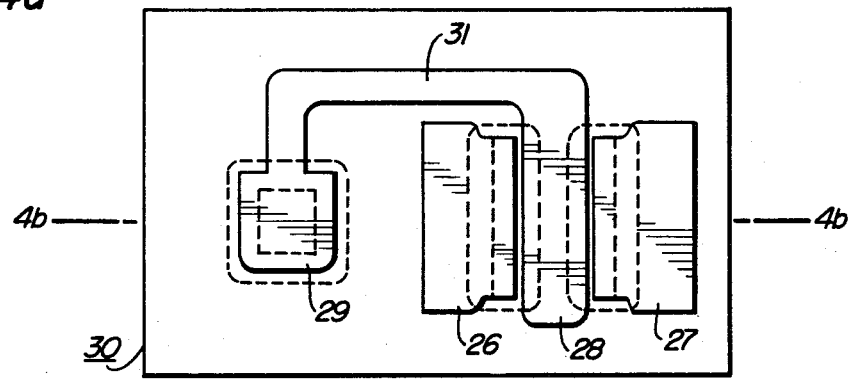
FIGS. 4a and 4b are a top side view of a circuit means comprising a protective diode and a field effect transistor according to one embodiment of this invention, and a cross-sectional view taken along the line 4b—4b, respectively.

Usually, as shown in FIGS. 1a and 1b, in order to prevent a surge noise voltage appearing at the insulated gate electrode 8 of the insulated gate field effect transistor 10 from causing a breakdown of the insulating film 2 between the gate electrode 8 and the semiconductor substrate 1 or the source region 3, a clamp protective diode having a breakdown voltage $V_{BD}$ lower than a breakdown voltage $V_{BG}$ of the insulating film 2 is formed in the substrate together with the field effect transistor.

In these figures the substrate 1 is generally N-type silicon having a resistivity of 1 to 1.5 Ωcm. The P-type region 5 is formed simultaneously with the source region 3 and the drain region 4. A PN junction formed between the P-type region 5 and the N-type substrate 1 serves as the clamp diode. A source electrode 6, a drain electrode 7, one terminal 9 of the clamp diode, an interconnection layer 11 connecting the terminal 9 with the gate electrode 8, and a substrate electrode 12 in ohmic connection with the substrate are also illustrated in these figures.

An equivalent circuit of the above semiconductor device 10 is shown in FIG. 2, in which like reference numerals are used to denote like parts as shown in FIGS. 1a and 1b.

It is expected from this structure that even if a voltage souce 13 giving a higher surge voltage than $V_{BG}$ is applied at the input terminal, the voltage between the gate 8 and the source electrode 6 is clamped at the breakdown voltage $V_{BD}$ of the protective diode. Thus, the insulating film 2 under the gate electrode 8 will be protected from breaking down.

On the other hand, the input voltage due to a high surge voltage is actually not clamped at the breakdown voltage $V_{BD}$. The insulating film, therefore, frequently breaks down.

The reasons are thought to be the following.

(1) In the semiconductor device shown in FIGS. 1a and 1b a spread resistance R of a substrate 1 lies between the substrate electrode 12 and the PN junction portion of the clamp diode, which is formed between the region 5 and the substrate 1. (In a strict sense the resistance R includes the spread resistance as well as the wiring resistance and the contact resistance at the electrodes.) When a surge noise source 13 having an internal resistance r is applied, the voltage drop across the resistance R is not negligible unless r is much larger than R. Therefore, the voltage between the gate and source electrodes is not clamped substantially at the breakdown voltage $V_{BD}$ of the clamp diode. The surge voltage V is almost directly applied to the gate electrode. Thus the insulating film between the gate electrode and the semiconductor substrate (specifically between the gate electrode and the source region) breaks down. The resistance R in a prior art becomes about 500 to 1000Ω.

(2) It may be presumed that the diode before breakdown consists equivalently of a series circuit of the resistance R and of capacitance $C_d$, (this is the capacitance of about 2 PF existing at the PN junction of the diode) while the gate input circuit of the transistor consists equivalently of a series circuit of a capacitance $C_G$, (this is the actual capacitance of about 4 PF existing between the gate electrode and the source region) and a resistance $r_s$, (this is the resistance of about 50 to 100Ω existing in the source region 3). The capacitances $C_d$ and $C_G$ are charged in accordance with each time constant $\tau_D$ of about 1 to 2 n sec and $\tau_G$ of about 0.2 to 0.4 n sec, respectively. When the surge voltage having a rapid transient characteristic is applied, the terminal voltage $V_D$ across the capacitance $C_D$ (i.e., across the junction portion of the diode D) and the terminal voltage $V_G$ across the capacitance $C_G$ (i.e., across the insulating film between the gate electrode and the source region) vary with time as shown in FIG. 3.

Since the source region has generally a high impurity concentration and hence an extremely low resistivity, the resistance $r_s$ is much smaller, (for example, 50 to 100Ω) than the resistance R. The variations with time of the voltages $V_G$ and $V_D$ become respectively as shown by the curves 16 and 17 in FIG. 3. The curves 16 and 17 have a time constant of about 0.2 n sec and 1.0 n sec, respectively.

As described above, the breakdown voltage $V_{BD}$ of the diode, for example, 60 volts is fixed at a lower level than $V_{GB}$ of the gate insulating film, for example, 100 volts. When the transient effect is not considered, it is expected that the gate input voltage is clamped at $V_{BD}$. Actually, however, the gate voltage $V_G$ rises higher as shown by the curve 16 in FIG. 3. At time $t_1$ when $V_G$ reaches $V_{BG}$, the voltage $V_D$ of the diode is still lower than $V_{BD}$. Then the breakdown of the field effect transistor precedes that of the diode and the functioning of the diode becomes useless.

Figure 11:
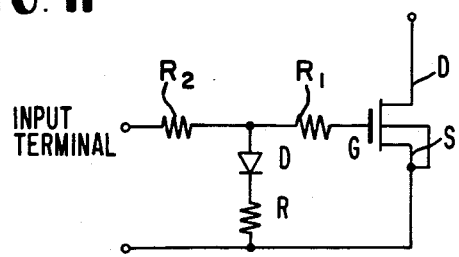
FIG. 11 is a circuit diagram of a further embodiment of this invention.

Therefore, according to some preferred embodiments of this invention the parasitic resistance (i.e., R in FIG. 2) in series with the protective diode is made much smaller than the impedance (r in FIG. 2) of the signal source generating a surge noise voltage so that the voltage drop across the resistance R becomes substantially negligible. For instance, it is preferable that the value of the resistance R does not exceed 200Ω. The voltage between the gate and source electrodes is precisely clamped at the breakdown voltage $V_{BD}$ of the diode, protecting thus the field effect transistor from a breakdown. The time constant $\tau_D$ of the clamp diode circuit determined by the value of $C_d \times R$ is made nearly equal to (curve 18 in FIG. 3) or less than (curve 19) the time constant $\tau_G$ of the input circuit of the field effect transistor connected in parallel with the diode, the time constant $\tau_G$ being determined by $C_G \times r_s$. If circumstances require it (as shown in FIG. 11), a resistor $R_1$ in series between the clamp diode electrode and the gate electrode may be connected to make the time constant $\tau_G$ large or close to $\tau_D$. The terminal voltage of the clamp diode thereby increases earlier up to the breakdown voltage $V_{BD}$, preventing the field effect transistor from breaking down.

As is evident from a comparison between the curves 16 and 18 in FIG. 3, it should be understood that the time constant $\tau_D$ of the diode circuit need not necessarily be smaller than the time constant $\tau_G$ of the gate input circuit, namely, it is sufficient that the terminal voltage $V_D$ reaches $V_{BD}$ at $t=t_2$ before the gate voltage $V_G$ reaches $V_{BG}$ at $t=t_1$. But in order to further perfectly protect the transistor, it is especially desirable that the time constant $\tau_D$ is selected smaller than the time constant $\tau_G$ as shown by the curve 19 in FIG. 3.

Concrete embodiments of this invention will be explained hereunder with reference to the drawings.

Embodiment 1

Figure 4B:
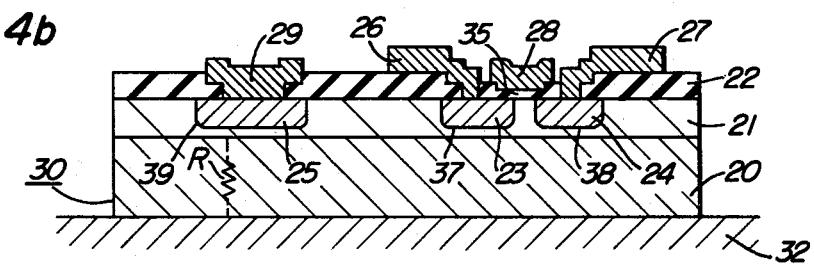

In a semiconductor device shown in FIGS. 4a and 4b, 20 is a low resistivity silicon substrate of first conductivity type, e.g., an N-type silicon, having a thickness of 100 to 200μ, the resistivity being preferably equal to or less than 0.1 Ωcm. The layer 21 is a high resistivity silicon layer of first conductivity type formed on the substrate 20, the resistivity being 1 to 5 Ωcm and the thickness being about 6 to 10Ω. The layers 22 and 35 are insulating layers, e.g., silicon oxide layers, covering the semiconductor layer 21 and having a thickness of about 1,000 to 10,000 Å. The regions denoted 23, 24 and 25 are source and drain regions and a part of the diode region, respectively, having an opposite conductivity type to that of the substrate and having a depth of about 2 to 6μ. Layers 26, 27, 28, 29 and 31 are respectively metal layers forming a source electrode; a drain electrode, a gate electrode, a protective diode electrode, and an interconnection layer extending over the insulating layer 22 to connect the diode electrode 29 with the gate electrode 28. The member denoted 32 is a substrate electrode in resistive contact with the substrate 20, serving as the other electrode of the diode. The PN junctions 37, 38 and 39 are formed between the substrate and the regions 23, 24 and 25, respectively.

This structure enables the spread resistance R between the PN junction 39 of the diode and the substrate electrode 32 to be extremely small. For example, when the resistivity of the substrate is 0.1 Ωcm or 0.01 Ωcm. R can be made about 50 to 100Ω or about 10Ω, respectively. The spread resistance R can be much smaller than the impedance r of the signal source generating a surge noise voltage, and nearly equal to or less than the series parasitic resistance $r_s$ of the gate input circuit. In this embodiment the condition $\tau_G \geq \tau_D$ is satisfied because $C_D$ is estimated to about 2 PF, $C_G$ about 4 PF, and $r_s$ about 50Ω. Thus, the gate input voltage of the semiconductor device is substantially clamped near the breakdown voltage $V_{BD}$, for example, at about 60 volts of the protective diode, and the field effect transistor is precisely prevented from breakdown. As a result of measurements, it is found that the breakdown voltage $V_{BG}$ of the SiO$_2$ film beneath the gate electrode is about 100 to 130 volts.

Figure 5A:
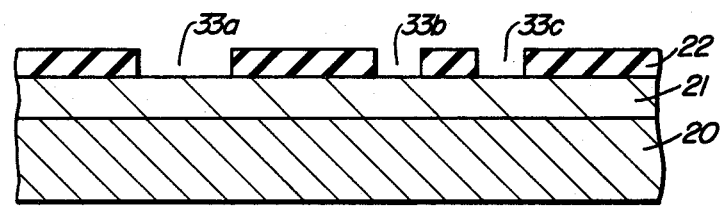

Concrete manufacturing steps of the semiconductor device are shown in FIGS. 5a to 5d. In FIG. 5a, 20 is an N+ type silicon monocrystalline substrate having a resistivity of 0.01 Ωcm, 21 an N-type silicon layer of resistivity 1.5 Ωcm formed on the substrate 20 by the epitaxial growth and 22 is an SiO$_2$ layer made by the thermal growth on the epitaxial layer 21.

This N+N epitaxial semiconductor member has been used for the manufacture of a junction transistor but not for the insulated gate type field effect transistor. The reasons are the following.

(1) The resistivity of the substrate should be preferably high for the formation of a channel layer in which an electric current flows.

(2) There is no need of using the expensive epitaxial wafer as no large current flows through the substrate.

In this embodiment according to this invention the epitaxial wafer is used for the purpose of reducing the parasitic resistance connected in series with the clamping diode.

Figure 5B:
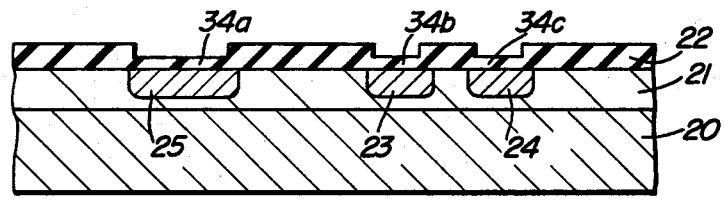

First as shown in FIG. 5a, with the use of the well known photoetching technique a plurality of holes 33a, 33b and 33c reaching the semiconductor layer 21 are perforated into the SiO$_2$ film 22. Next, as shown in FIG. 5b, a P-type impurity (e.g., boron) is diffused through the holes 33a, 33b and 33c to form P-type regions 23, 24 and 25 having a surface impurity concentration of about $10^{18}$ to $10^{19}$ atoms/cm$^3$, respectively. As the diffusion is performed in the oxydizing atmosphere, thin SiO$_2$ layers 34a, 34b and 34c are again formed in the holes 33a, 33b and 33c.

Figure 5C:
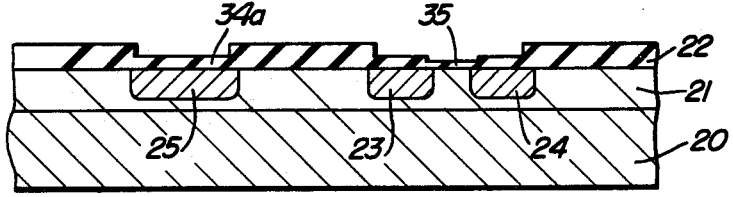

In FIG. 5c in order to increase the mutual conductance of the field effect transistor, the SiO$_2$ film 35 for a gate electrode is made as thin as about 1,000 to 2,000 Å, while the thicker portion 22 thereof is 5,000 to 10,000 Å. The thin SiO$_2$ layer 35 can be obtained by etching the SiO$_2$ layer 22 selectively and thereafter, growing a new SiO$_2$ layer thereon. The SiO$_2$ portions for the formation of electrodes are removed as shown in FIG. 5d to form holes 36a, 36b and 36c. Then metal electrode layers are formed by depositing aluminium on the substrate as shown in FIG. 4b. The substrate 20 is soldered to the support metal electrode 32, obtaining thus the semiconductor device as shown in FIGS. 4a and 4b.

It is necessary in this semiconductor device that the P-type drain region 24 (see FIG. 4b) and the low resistivity semiconductor substrate 20 are kept at a sufficient interval or spacing therebetween so that a depletion layer extending from the junction 38 when applying a drain bias voltage to the region 24, will not reach the region 20. However, a large interval therebetween means a large spread resistance R, which is an unfavorable situation. In this embodiment, therefore, it is desirable that the interval be selected from about 2 to 8μ. The clamping diode is formed about 50μ square.

Figure 9A:
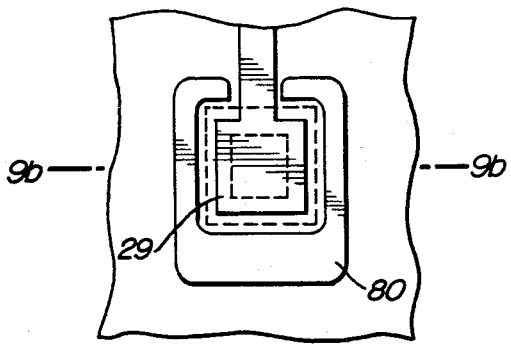
FIGS. 9a and 9b are a partial top side view of another modified embodiment of this invention and a partial cross-sectional view taken along the line 9b—9b, respectively.
Figure 9B:
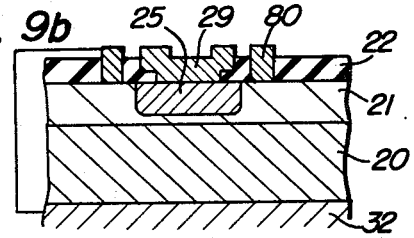
Figure 10:
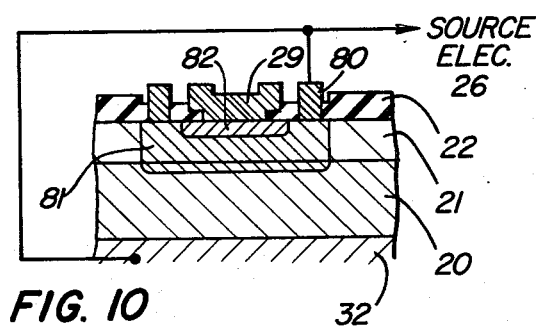
FIG. 10 is a cross-sectional view of a further modified embodiment of this invention.

When the breakdown voltage of the clamping diode junction 39 is too high, it may be well to introduce an N-type impurity preliminarily before the formation of a P-type region 82, thereby to form an N-type low resistivity region 81 as shown in FIG. 10. In order to further reduce the spread parasitic resistance R, the electrode 80 may be made to surround the P-type region 25 or 82 as shown in FIGS. 9a and 9b or in FIG. 10, respectively. The electrode 80 may be connected to the source electrode 26 and/or to the substrate electrode 32 (shown in FIG. 10 of the drawings).

Embodiment 2

Next, another embodiment according to this invention will be explained.

Figure 12:
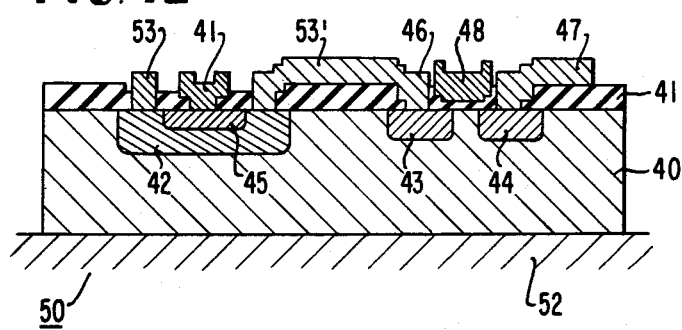
FIG. 12 is a cross-section of still a further modified embodiment of this invention.

FIGS. 6a and 6b show a semiconductor device comprising a high resistivity semiconductor substrate, i.e., an N-type silicon substrate 40 having a resistivity of 1 Ωcm; an SiO$_2$ film 41 having a thickness of 1,000 to 10,000 Å; and N-type diffused low resistivity region 42; P-type diffused source, drain, and diode regions 43, 44 and 45; metal, e.g., aluminium, layers 46, 47, 48, 49, 51 and 53; and a support electrode 52. The field effect transistor portion comprising a source region 43, a drain region 44, a source electrode 46, a drain electrode 47 and a gate electrode 48 is made by a conventional method or a similar method to that of the above embodiment. The N-type region 42 at the clamp diode portion has a lower resistivity (e.g., 0.5 Ωcm) than that of the substrate 40, and the PN junction formed between the P-type region 45 and the N-type region 42 is formed shallower than the one at the P-type source region 43 or the drain region 44. This shallower PN junction structure has the advantage of decreasing the breakdown voltage of the diode. The electrode 53 surrounds the P-type diffused region 45 to reduce the spread resistance existing in series with the diode and, as shown in FIG. 12, may be interconnected to the source electrode 46 through a metal layer 53' extending over the SiO$_2$ film 41.

Figure 8A:
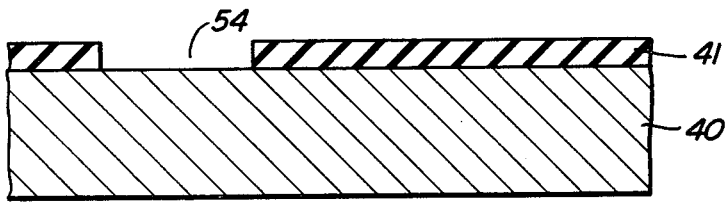
FIGS. 8a to 8d are cross-sectional views showing the manufacturing steps of a circuit means shown in FIG. 7.
Figure 8B:
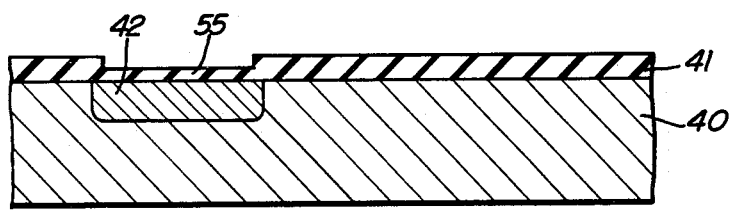
Figure 8C:
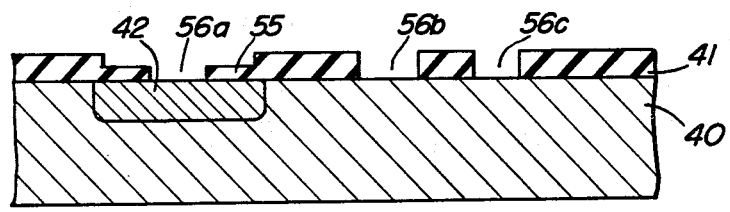
Figure 8D:
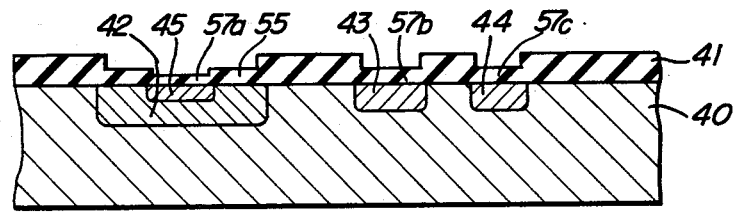

The manufacturing steps of this semiconductor device 50 are shown in FIGS. 8a and 8b. First, as shown in FIG. 8a, a hole 54 is perforated into the SiO$_2$ film 41. As shown in FIG. 8b, an N-type impurity is diffused into the N-type substrate 40 through the opening 54. The concentration of the introduced N-type impurity is adjusted in accordance with the desired breakdown voltage of the diode. In the above diffusion process an SiO$_2$ film 55 is again formed in the hole 54. Next, as shown in FIG. 8c, a plurality of holes 56a, 56b and 56c, through which a P-type impurity is diffused, as shown in FIG. 8d, to form P-type regions 43, 44 and 45, are perforated. SiO$_2$ layers 57a, 57b and 57c are formed again in the holes 56a, 56b and 56c, respectively. The P-type region 45 formed in the N-type region 42 by this diffusion process has a shallower depth than that of P-type regions 43 and 44, the impurity concentration of the region 42 being larger than that of the substrate region 40. Thereafter, the portion of the SiO$_2$ layer covering the substrate surface between the regions 43 and 44 is made to have a thickness of about 1,000 to 2,000 Å, a plurality of holes are formed in the SiO$_2$ layer 57a, 57b and 57c, and then aluminium layers are deposited by vapor phase deposition, obtaining thus a semiconductor device shown in FIGS. 6a and 6b.

Embodiment 3

Next, a further embodiment according to this invention will be explained.

The semiconductor device shown in FIG. 7 has the same field effect transistor structure as that of the semiconductor device shown in FIGS. 6a and 6b. But the N+ type region 62 at the clamp diode in FIG. 7 is formed ring-like, containing a P-type region 65 therein, while that in FIGS. 6a and 6b is dish-like. In this respect, the device shown in FIG. 7 is different from the device in FIG. 6b.

The breakdown voltage of the clamp diode can be controlled by the impurity concentration of the N-type region 62. In order to reduce the spread resistance, an electrode 73 is fitted to the N-type region 62 to surround the P-type region 65 in a similar manner to that of the electrode 53 in FIGS. 6a and 6b.

In the further embodiment of this invention, the surface impurity concentration of the low resistivity semiconductor regions 42, 62 or 31, shown in FIGS. 6a and 6b, FIG. 7, or FIG. 10, respectively, is selected high enough to prevent the undesirable parasitic field effect phenomenon caused by a voltage application to the interconnection layer, which appears between the field effect transistor regions and the protective diode region in the surface of the semiconductor substrate. Referring to FIGS. 6a and 6b, for example, the low resistivity diffused layer 42 contributes not only to decrease the resistance R but also in the case of a signal voltage application to the interconnection layer 51, to prevent a short-circuit between the P-type diode region 45 and the P-type source and/or drain regions by means of a P-channel appearing in the substrate surface under the interconnection layer 51. Thus, the complete clamping action of the diode is assured.

The low resistivity regions 42, 62 or 81 inserted between the two electrode terminals of the diode have the advantage of decreasing the reverse breakdown voltage V$_{BD}$ of the protective diode. It is seen in FIG. 3 that in a field effect transistor with a clamping diode having a lower breakdown voltage, the breakdown of the diode occurs much earlier than the time t$_1$ when the gate insulator suffers a dielectric breakdown and that the value (t$_1$−t$_2$) can be made larger.

Although in the above embodiments the protection of a P-channel MIS field effect transistor has been particularly shown and described, this invention can also be applied to one involving an N-channel depletion mode.

In this case one portion of the low resistivity region may be exposed to surround the protective diode region and cut off the reversed N-type surface layer generated due to the insulating layer.

Although in the above embodiment the semiconductor substrate is made of silicon, other semiconductors such as germanium and intermetallic compounds may be used. In the case of an intermetallic compound, the semiconductor insulator cannot be made by thermal growth from substrate but should be deposited by vapor phase deposition. The insulator may be silicon nitride and glass, etc., as well as silicon oxide.

When the signal source impedance is extremely small, in order to make it larger than the resistance R of the clamp diode, it is desirable to insert a resistor R$_2$ of several hundred ohms between the input terminal and the electrode 9 of the clamp diode D, as shown in FIG. 11. The resistor has the practical advantage of decreasing the effect of the parasitic resistance R inserted in series with the diode.

I claim:

1. A semiconductor device comprising:
a semiconductor material of a first conductivity type including a relatively high resistivity region extending to a major surface of said semiconductor material, and a relatively low resistivity region;
a semiconductor region of a second conductivity type opposite to the first conductivity type contacting the semiconductor material at said major surface thereof and closely spaced from said relatively low resistivity region;
an insulating film including a relatively thick portion and a relatively thin portion, the relatively thin portion being formed so as to cover the major surface of said relatively high resistivity region and being susceptible to electro-static breakdown; and
an electrode formed on said relatively thin portion, spaced from said relatively high resistivity region and electrically connected to said semiconductor region;
the PN junction formed between said semiconductor region and said semiconductor material having a backward breakdown voltage lower than the electro-static breakdown voltage of said relatively thin portion of the insulating film below said electrode; and further including
a first additional electrode contacting said region of low resistivity at a surface of said semiconductor material opposite said major surface, and including a second additional electrode disposed on said semiconductor material and contacting said semiconductor region of high resistivity while being connected to said first additional electrode.

2. A semiconductor device comprising:
a semiconductor substrate of a first conductivity type having a pair of opposing first and second main surfaces, said semiconductor substrate including a relatively high resistivity region extending to said first main surface and a relatively low resistivity region adjacent to said relatively high resistivity region and extending to said second main surface;
an insulated gate field effect component formed at a first portion of said relatively high resistivity region, said insulated gate field effect component including source and drain regions of a second conductivity type opposite the first conductivity type formed in said first portion, a gate insulating film covering the first main surface of said first portion located between said source and drain regions, and a gate electrode formed on said gate insulating film;

a protective component formed at a second portion of said relatively high resistivity region spaced from said first portion thereof, said protective component including a first semiconductor region of the first conductivity type having a relatively low resistivity, surrounded by said relatively high resistivity region and extending to said first main surface, a second semiconductor region of the second conductivity type extending to said first main surface and formed in contact with said first semiconductor region so as to form, with said first semiconductor region, a PN junction having a backward breakdown voltage lower than the electro-static breakdown voltage of said gate insulating film below said gate electrode at said first portion of said relatively high resistivity region, and a first electrode contacted with said major surface of said first semiconductor region in the vicinity of said second semiconductor region;

a low resistance region between said second semiconductor region and said relatively low resistivity region;

a second electrode contacted with said relatively low resistivity region at said second main surface opposite to said first and second portions of said relatively high resistivity region, said second electrode being electrically connected to said first electrode; and conductive means for coupling said gate electrode of the insulated gate field effect component at said first portion of said relatively high resistivity region to said protection component.

* * * * *